(12) United States Patent
Zhu et al.

(10) Patent No.: US 7,355,201 B2
(45) Date of Patent: Apr. 8, 2008

(54) TEST STRUCTURE FOR MEASURING ELECTRICAL AND DIMENSIONAL CHARACTERISTICS

(75) Inventors: Jianhong Zhu, Austin, TX (US); David D. Wu, Austin, TX (US); Mark W. Michael, Cedar Park, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 16 days.

(21) Appl. No.: 11/426,723

(22) Filed: Jun. 27, 2006

(65) Prior Publication Data

US 2007/0296444 A1    Dec. 27, 2007

(51) Int. Cl.
*H01L 23/58*    (2006.01)
(52) U.S. Cl. .............. 257/48; 257/797; 257/E21.521; 257/E23.179; 257/E21.524; 438/18
(58) Field of Classification Search ............ None
See application file for complete search history.

(56) References Cited

U.S. PATENT DOCUMENTS

| | | | | |
|---|---|---|---|---|
| 4,855,253 A | * | 8/1989 | Weber | 438/18 |
| 6,136,619 A | * | 10/2000 | Ceuninck et al. | 438/18 |
| 6,528,818 B1 | * | 3/2003 | Satya et al. | 257/48 |

* cited by examiner

*Primary Examiner*—A. Sefer
*Assistant Examiner*—Scott R. Wilson
(74) *Attorney, Agent, or Firm*—Williams, Morgan & Amerson, P.C.

(57) ABSTRACT

A test structure includes first and second combs, at least a first pair of base nodes, and a second pair of finger nodes. The first comb includes a first base and a first plurality of fingers extending from the first base. The second comb includes a second base and a second plurality of fingers extending from the second base. At least a portion of the first and second pluralities of fingers are interleaved. The first pair of base nodes extend from the first base. The second pair of finger nodes extend from a first finger of the first plurality of fingers.

21 Claims, 4 Drawing Sheets

TEST STRUCTURE FOR MEASURING ELECTRICAL AND DIMENSIONAL CHARACTERISTICS

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to the field of semiconductor manufacturing and, more particularly, to the use of a test structure for measuring electrical and dimensional characteristics.

A conventional integrated circuit device, such as a microprocessor, is typically comprised of many thousands of semiconductor devices, e.g., transistors, formed above the surface of a semiconductive substrate. For the integrated circuit device to function, the transistors must be electrically connected to one another through conductive interconnect structures. Many modern integrated circuit devices are very densely packed, i.e., there is very little space between the transistors formed above the substrate. Thus, these conductive interconnect structures must be made in multiple layers to conserve plot space on the semiconductive substrate.

The conductive interconnect structures are typically accomplished through the formation of a plurality of conductive lines and conductive plugs formed in alternative layers of dielectric materials formed on the device. As is readily apparent to those skilled in the art, the conductive plugs are means by which various layers of conductive lines, and/or semiconductor devices, may be electrically coupled to one another. The conductive lines that connect the various interconnect structures are commonly formed in trenches defined in the dielectric layers.

The term "contact" is generally used to define an interconnect structure (e.g., using polysilicon or metal) to underlying polysilicon or silicon (e.g., a gate electrode or a source/drain region of a transistor), while a "via" denotes a metal to metal interconnect structure. In either case, a contact opening is formed in an insulating layer overlaying the conductive member. A second conductive layer is then formed in the contact opening and electrical communication is established with the conductive member.

During the fabrication of semiconductor devices on a wafer, test structures are commonly formed on the wafer coincident with the discrete semiconductor die. The test structures typically include trenches filled with copper similar in construct to the actual trenches and lines that comprise the functional semiconductor devices. Because the processes used to form functional devices is also used to form the test structures, characteristics of the semiconductor devices may be inferred by evaluating the results of testing on the test structures. Defects that exist in the test structure are likely to be similar in type and distribution to those present in the semiconductor devices.

For example, capacitance and resistance tests performed on the test structures give insight as to the capacitance and resistance properties of the semiconductor devices. Test structures may be formed on the same wafer with actual devices, or alternatively, they may be formed on dedicated test wafers on which no saleable devices are present. Typically, different test structures are used to measure different parameters associated with the devices. For example, an interleaved comb structure may be used to measure capacitance, thus providing a metric related to the dielectric constant of the insulating layer in which the lines are formed. A separate structure may be used to measure resistance. Yet another structure may be used to measure physical characteristics, such as critical dimensions.

The various test structures are disposed in multiple locations across a wafer. Due to the large number of discrete steps involved in the manufacture of semiconductor devices, there are many sources of variation that contribute to the physical and electrical characteristics of the completed device. Some sources of variation affect an entire wafer, while others have localized effects, i.e., cross wafer or cross-die variation. Due to the spatial distribution of the test structures, it is potentially difficult to discern between sources of variation to enable the processes to be adjusted to achieve improved results.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

One aspect of the present invention is seen in a test structure including first and second combs, at least a first pair of base nodes, and a second pair of finger nodes. The first comb includes a first base and a first plurality of fingers extending from the first base. The second comb includes a second base and a second plurality of fingers extending from the second base. At least a portion of the first and second pluralities of fingers are interleaved. The first pair of base nodes extends from the first base. The second pair of finger nodes extends from a first finger of the first plurality of fingers.

Another aspect of the present invention is seen a method for using a test structure. The test structure first and second combs, at least a first pair of base nodes, and a second pair of finger nodes. The first comb includes a first base and a first plurality of fingers extending from the first base. The second comb includes a second base and a second plurality of fingers extending from the second base. At least a portion of the first and second pluralities of fingers are interleaved. The first pair of base nodes extends from the first base. The second pair of finger nodes extends from a first finger of the first plurality of fingers. A first current is provided through one of the base nodes and one of the finger nodes. A first voltage is measured across the remaining base node and the remaining finger node. A resistance of the first finger is determined based on the first voltage and a magnitude of the first current.

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

BRIEF DESCRIPTION OF THE SEVERAL VIEWS OF THE DRAWINGS

The invention will hereafter be described with reference to the accompanying drawings, wherein like reference numerals denote like elements, and.

Figure 1A:
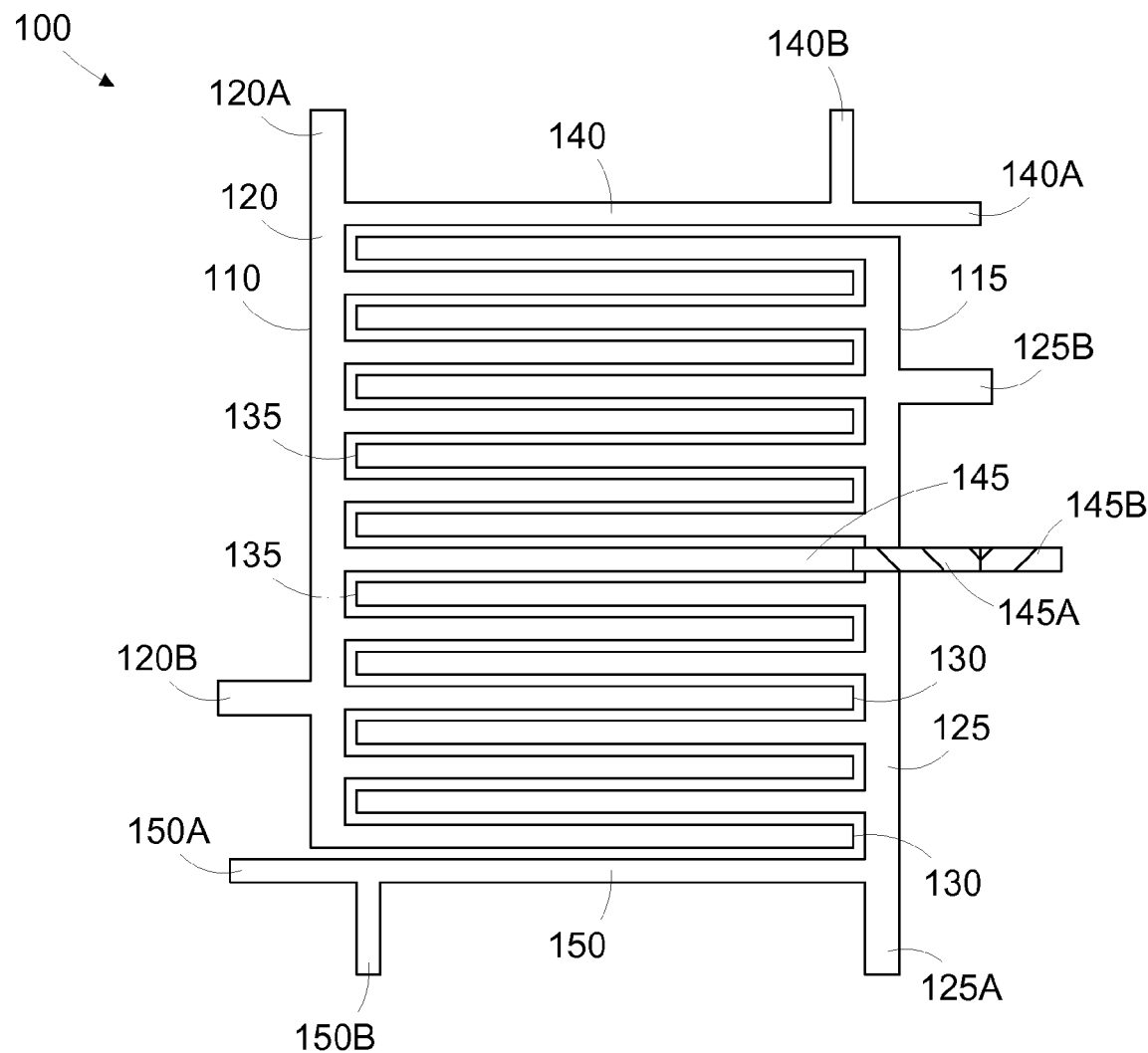
FIG. 1A is a top view of a test structure in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1A, the present invention shall be described in the context of an illustrative test structure 100. Generally, the test structure 100 may be used for determining various electrical parameters, such as capacitance, leakage current, and resistance, as well as physical parameters, such as critical dimensions. Because a single test structure 100 in a single location is used to determine these parameters, cross-wafer or cross-die variation may be distinguished from generalized variation.

In the illustrated embodiment, the test structure 100 includes copper features formed in trenches defined in an insulating layer. As seen in FIG. 1A, the test structure 100 includes combs 110, 115, each having a base 120, 125 and fingers 130, 135, respectively. The fingers 130, 135 are interleaved. For clarity and ease of illustration, only a small subset of the fingers 130, 135 are illustrated. In an actual embodiment, each comb 110, 115 may include hundreds or thousands of fingers 130, 135. Moreover, the length of the fingers 130, 135 with respect to the width of the base 120, 125 is shortened for purposes of illustration, as an actual test structure 100 would include longer fingers.

Figure 1B:
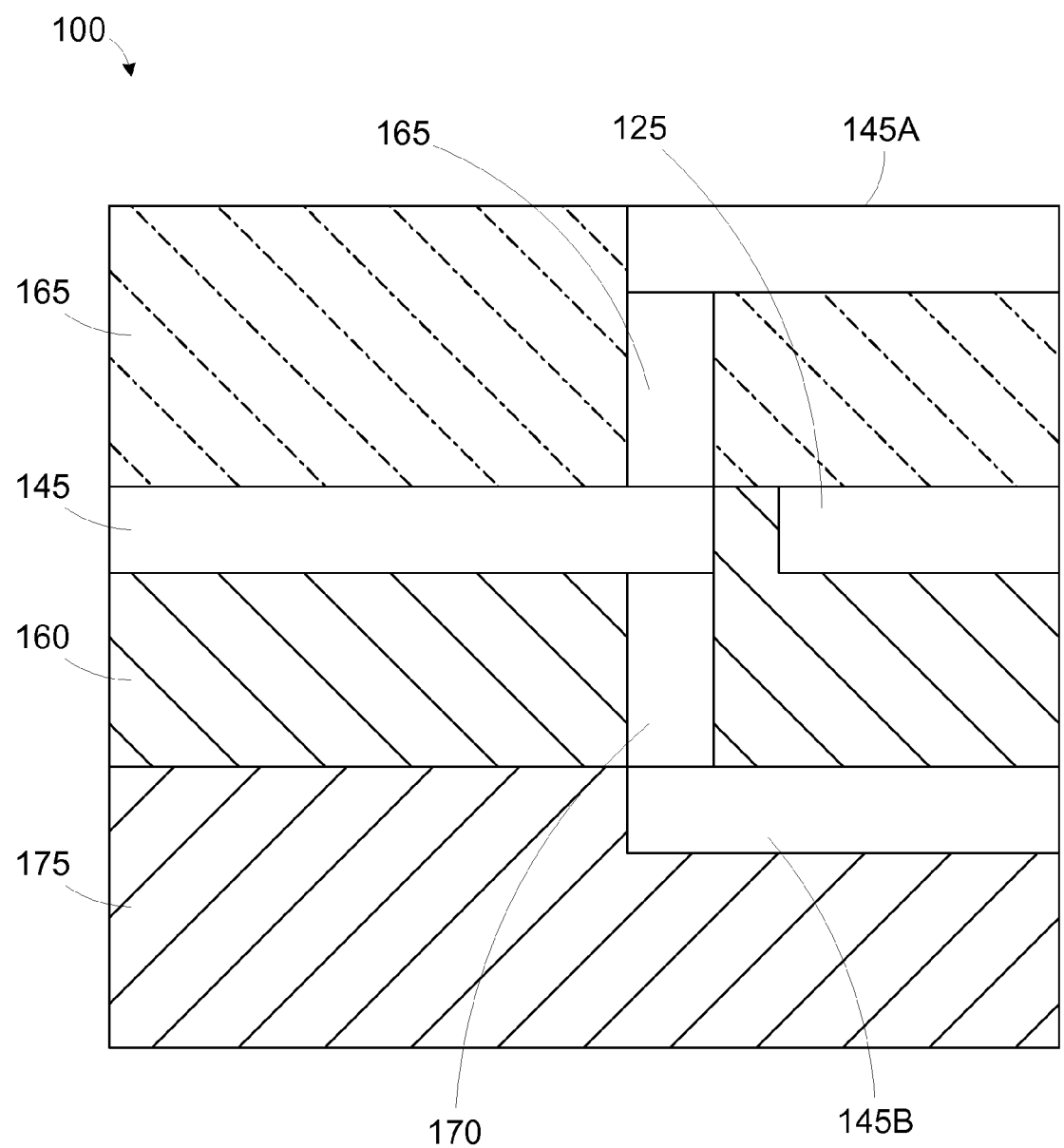
FIG. 1B is a partial cross-section view of the test structure of FIG. 1A.

Node connections are made to various parts of the test structure 100 to facilitate testing. Each comb base 120, 125 includes a pair of base nodes 120A, 120B, 125A, 125B, respectively. Selected fingers 130,135, such as the fingers 140, 145 on the comb 110 and the finger 150 on the comb 115 include finger nodes 140A, 140B, 145A, 145B, 150A, 150B, respectively. Again, due the significantly larger number of fingers 130, 135 present in an actual test structure 100, the number of fingers provided with nodes may be significantly larger than the number illustrated. Furthermore, due to the increased comb length required to facilitate the larger number of fingers, additional base nodes may also be provided. In FIG. 1A, finger nodes 145A, 145B are illustrated with different cross-hatching to indicate that they are located on different metal layers than the test structure 100 and pass over or under the base 125 rather than passing through it. As seen in FIG. 1B, the finger 145 and base 125 are formed in a first layer 160. A via 165 couples the finger 145 to the finger node 145A in a layer 165 above the layer 160, and a via 170 couples the finger 145 to the finger node 145B in a layer 175 below the layer 160. This arrangement is provided so that the finger nodes 145A, 145B may avoid the base 125 to extend beyond the test structure 100 to allow connections to pads. The finger nodes may each be located on different layers and run parallel to one another (as illustrated) or they may share a common via and be located on a single layer above or below the test structure 100 (i.e., with an angular orientation similar to finger nodes 140A, 140B or 150A, 150B.

Although not illustrated, the base nodes 120A, 120B, 125A, 125B and finger nodes 140A, 140B, 145A, 145B, 150A, 150B are connected to a plurality of contact pads to facilitate testing. The contact pads may be located in various locations, including near the top or bottom of the test structure 100, or both. They may be located on the same or a different metal layer as the test structure. In the case where the contact pads are located on different metal layers, vias may be provided for linking the contact pads to the nodes.

In general, the base nodes 120A, 120B, 125A, 125B facilitate capacitance or leakage current testing, while the finger nodes 140A, 140B, 145A, 145B, 150A, 150B facilitate resistance testing. The fingers 140,145,150 function as metal Kelvin lines and allow resistance to be measured. The fingers 130, 135 may also serve as critical dimension test structures. A destructive cross-sectional test may be performed to measure critical dimension attributes of the metal lines making up the test structure 100, such as width, depth, sidewall profile, degree of surface degradation, etc.

Capacitance and leakage current measurements may be conducted using the test structure 100 by applying voltage signals to the base nodes 120A, 120B, 125A, 125B in accordance with known techniques. For example, to measure leakage current appropriate voltages are applied to the combs 120, 125, and the resulting current is measured. To measure capacitance one of the combs 120 is grounded and a voltage is applied to the other comb 125. In some embodiments, shielding electrodes (not shown) are formed in metal layers above and below the test structure 100. During the capacitance measurement, the shielding layers are also grounded. A capacitance tool may be used to measure the capacitance of the test structure 100. The procedures for determining these electrical characteristics are well known to those of ordinary skill in the art, and thus, are not discussed in greater detail herein.

Resistance measurements are conducted using selected base nodes 120A, 120B, 125A, 125B and finger nodes 140A, 140B, 145A, 145B, 150A, 150B. Generally, using a Kelvin line resistance measurement technique, a current of known magnitude is passed though a line and the voltage across the line is measured to allow the resistance to be calculated using a variant of Ohm's law (i.e., R=V/I). Ideally, the voltage is measured outside the current path so that the measured voltage drop is not affected by the voltage measurement path. Hence, four terminals communicating with the line are typically needed for a Kelvin line resistance measurement, two for injecting the known current, and two for observing voltage drop across the line.

With respect to finger 140, resistance may be measured by injecting a current (i.e., using a test unit and the pads) into one pair of nodes, such as the base node 120A and finger node 140A, and measuring a voltage drop across the remaining nodes associated with the finger 140, base node 120B and finger node 140B. Of course, the different combinations of the nodes may be selected to achieve an equivalent result. Similarly, with respect to finger 145, resistance may be measured by injecting a current into base node 120B and finger node 145A and measuring a voltage drop across base node 120A and finger node 145B. Finally, the resistance of finger 150 may be measured by injecting a current into base node 125A and finger node 150A and measuring a voltage drop across base node 125B and finger node 150B.

Note that base node 120B and finger node 150A are spaced from one another by a distance sufficient to negate any capacitance contribution they might have on the overall capacitance of the test structure 100. For example, they may be spaced apart by at least 5 times the spacing between interleaved fingers 130, 135. Also, note that base node 120B is disposed below finger 145 in the plan view such that one base node 120a is located above the finger 145 and the other base node 120B is located below the finger 145. This allows the base node 120B to be out of the current path when a current signal is injected into base node 120A and one of the finger nodes 145A, 145B. If the base node 120B were to be located above the finger 145, the voltage drop across the section of the base 120 between the base node 120B and the finger 145 would affect the resistance measurement. Again, as the total number of fingers, the number of fingers 130, 135 provided with measurement nodes, and the number of base nodes may vary, this spacing convention may be used to provide independent nodes for measuring the resistance of the selected fingers.

Figure 2:
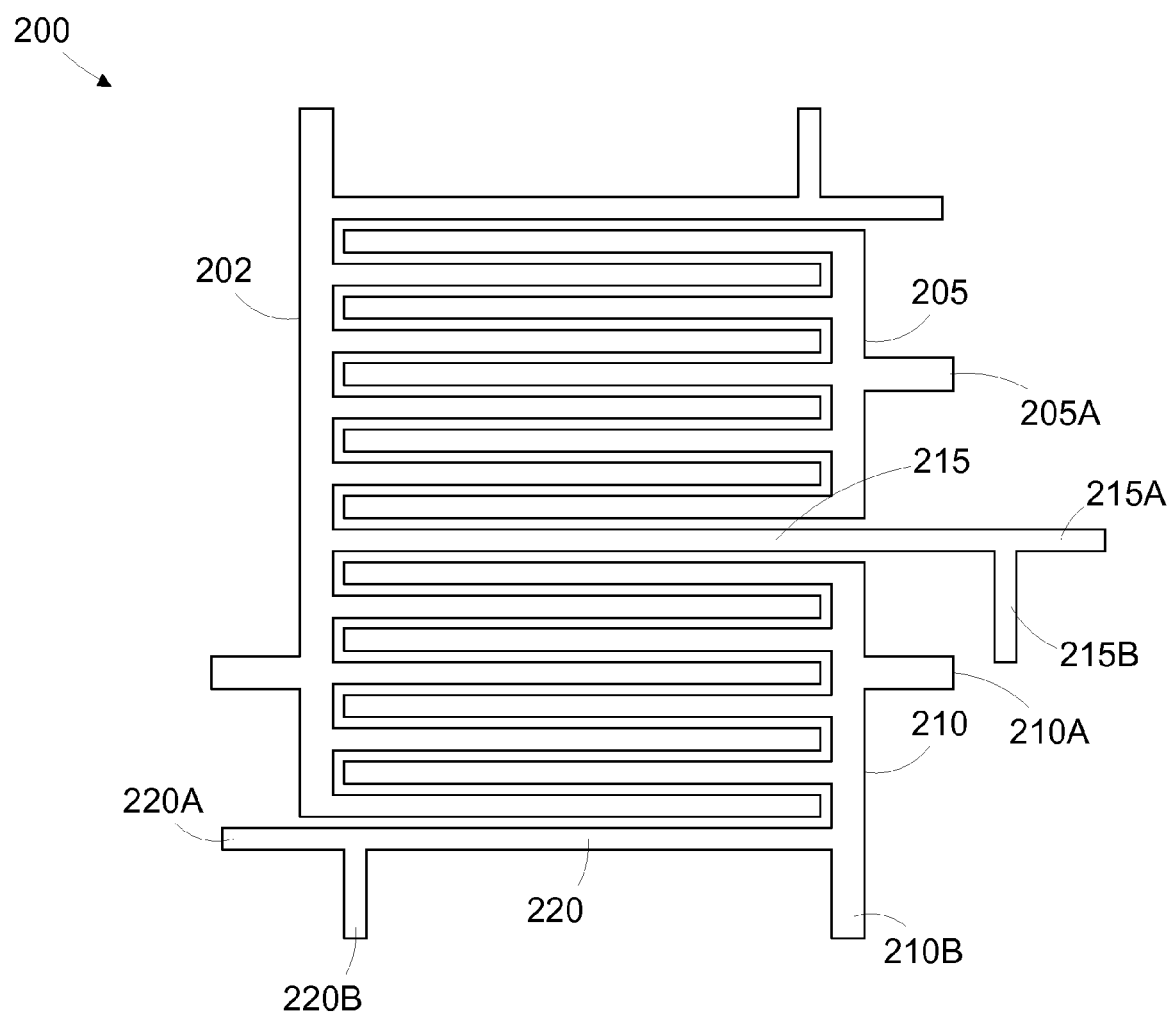
FIG. 2 is a top view of a test structure in accordance with another illustrative embodiment of the present invention.

Turning now to FIG. 2, a top view of a test structure 200 in accordance with another embodiment of the present invention is provided. In the test structure of FIG. 2, a comb 202 similar to the comb 110 in the test structure 100 of FIG. 1A is provided. However, the interfacing structure includes segmented combs 205 and 210 that are spaced apart to allow finger nodes 215A, 215B to extend from a finger 215 on the comb 202 without requiring multiple metal layers. The combs 205 and 210 may be coupled to form a single structure for capacitance measurement using base nodes 205A and 210A and the pads (not shown). The comb 210 is provided with multiple base nodes 210A, 210B for measuring the resistance of finger 220 in conjunction with finger nodes 220A, 220B. If designated fingers on the comb 205 are to be measured, additional base nodes may be provided to provide the necessary independent current and voltage measurement sites. Moreover, the comb 202 may also be segmented to allow finger nodes extending from fingers on the combs 205, 210 to be measured.

Figure 3:
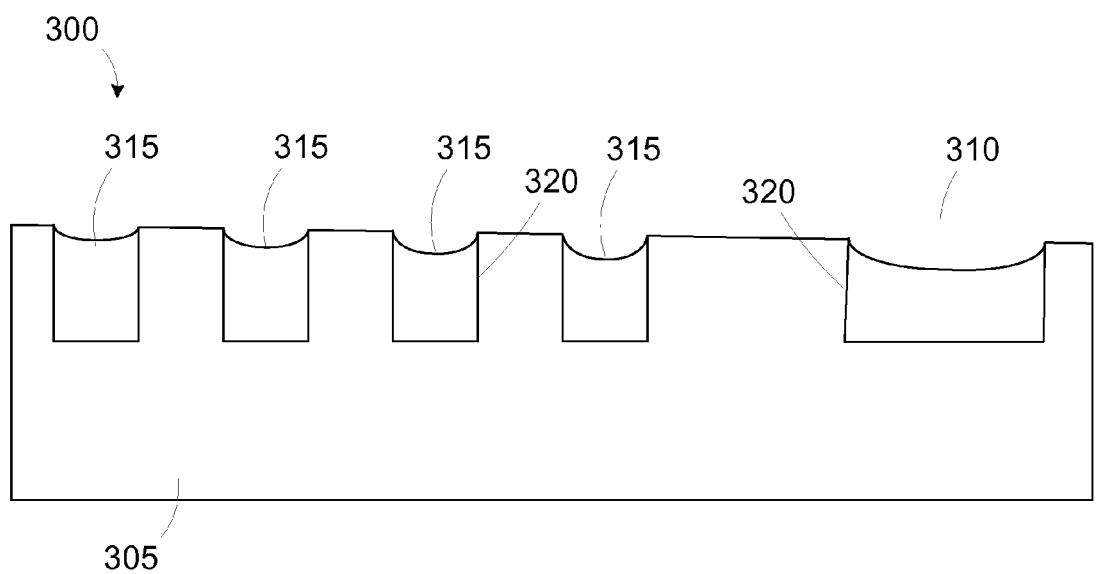
FIG. 3 is a cross section view of a test structure illustrating the effects of surface degradation.

Referring now to FIG. 3, a partial cross section view of a test structure 300 (e.g., the test structure 100 of FIG. 1A or the test structure 200 of FIG. 2) is provided. The test structure is formed in an insulating layer 305. An illustrative contact pad 310 is disposed near the test structure 300 for connecting to one of the finger nodes or base nodes (e.g., as described in FIGS. 1 and 2). Typically, the contact pad 310 has a significantly larger surface area than the fingers 315 of the test structure 300. To form the test structure 300 and contact pad 310, trenches 320 are formed in the insulating layer 305 and filled with metal (e.g., copper). The metal layer extending beyond the trenches 320 is removed using a chemical mechanical planarization (CMP) process.

Typically, the planarization process continues until the insulating layer 305 is reached. Although various endpoint detection techniques may be used for determining the end point for the planarization process, such techniques are approximate, and some planarization may continue after the insulating layer 305 has been reached. The chemical slurry used in the polishing process has a higher etch rate for copper than for the insulating layer 305. Hence, when the insulating layer 305 is reached, and planarization continues, the copper filling the trenches 320 is removed at a faster relative rate. A flexible polishing pad used in the polishing process may conform to the surface of the insulating layer 305 and the copper and continue to remove the copper at a faster rate, resulting in a phenomenon commonly referred to as "dishing." Generally, the susceptibility of the copper layer filling the trenches 320 to dishing is dependent somewhat on the width and spacing (i.e., pitch) of the trenches 320. Wider features allow the polishing pad to conform to the surface easier and exacerbate a dishing problem.

Due to its larger relative size, the pad 310 is more susceptible to surface degradation than the fingers 315. The pads 310 have a higher metal density and are typically vertically stacked. Hence, the regions in an around pad areas are softer than other areas. As a result the planarization process removes both the copper material and the surrounding dielectric material at a higher rate in the regions close to the pads 310. This effect is cumulative for the pad regions as subsequent layers are formed and processed due to the vertical stacking. The fingers 315 closest the pad 310 tend to experience increased surface degradation relative to those further from the pad 310. In the case where pads are located on both sides of the test structure 300 (i.e., above and below), the center fingers 315 experience the least surface degradation, while the peripheral fingers 315 experience the most. Hence, the degree of surface degradation is largest at the pad 310 and tends to decrease approximately linearly as the distance from the pad 310 increases. This surface degradation gradient is illustrated on FIG. 3, albeit the degree of surface degradation and the gradient are exaggerated for purposes of illustration. The feature dimensions and spacings are not intended to reflect an actual test structure, but rather just to illustrate the surface degradation issues.

Returning to FIG. 1A, because the fingers 140, 145, and 150 are dispersed across the test structure 100 resistance measurements may be used to identify variation across the test structure 100 due to surface degradation. Fingers 130, 135 with increased surface degradation will tend to have increased resistance parameters. Hence, if the resistance measured at all of the fingers 140, 145, 150 equipped with finger nodes is relatively constant, it may be inferred that little surface degradation is present or that the surface degradation gradient is small.

Figure 4:
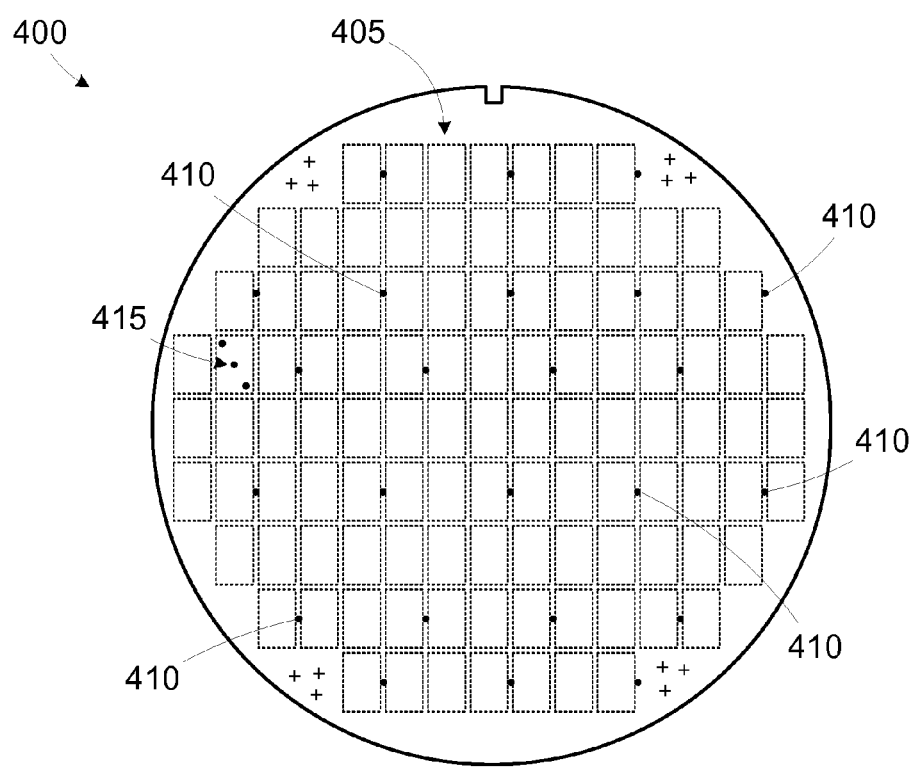
FIG. 4 is diagram illustrating test structures provided in various positions across a wafer.

Turning now to FIG. 4, which shows a diagram of an illustrative wafer 400 including a plurality of die 405 and a plurality of test structures 410 formed in the regions between the die 405, across wafer-variation may also be distinguished from general variation affecting the entire wafer 400. Test structures 410 may be distributed across the wafer 400 to facilitate resistance, capacitance, and dimensional testing at various locations. The relative sizes of the die 405 and test structures 410 are provided for illustrative purposes only. In one embodiment, the test structures 410 may be formed in the scribe line areas between the die 405, so as not to consume real estate within the die. In other embodiments, multiple test structures 410, such as the group 415 may be formed within the die 405 to provide facilitate the identification of cross-die variation. Moreover, the locations and number of test structures 410 may also vary.

Variation in the measurements obtained using the test structures 410 may be classified die to the number and arrangement of test structures 410. Patterns in variation across the wafer may then be identified using results from test structures located in different regions across the wafer 400. If the measurements are consistent with one another, observed variation (e.g., compared to other wafers may be due to a process that affects the entire wafer 400). If the measurements differ, the variation may be the result of a process that tends to exhibit a variation profile across the wafer, such as a plasma etch process or a CMP process. Still other sources of variation may be classified by evaluating the differences at different points within a single test structure 410 (i.e., finger resistance at different fingers). Such local information may help identify across-die variation, such as localized surface degradation gradients.

In the case where test structures 410 are formed in the scribe lines between die 405, when the wafer is cut to separate the die 405, the test structures 410 will also be cut, and the cross-section views of the test structures 410 may be examined to measure the critical dimensions of the lines making up the test structure 410. In other cases, destructive tests may be performed to evaluate the dimensions of the test structures prior to the completion of fabrication. For example, during the qualification of the fabrication settings for a particular design, test wafers, or a limited number of production wafers, may be selected for destructive testing. The test structures 410 may be cut and a cross-section analysis may be completed.

The test structures 100, 200 described herein are useful for determining performance characteristics of the semiconductor devices formed using like processes. As the test structures 100, 200 allow the measurement of resistance, capacitance, and critical dimensions at a single location, sources of variation in the performance characteristics may be identified. The collection of electrical (e.g., resistance and capacitance) and physical data from the same location generates self-consistent electrical and physical data, which helps identify the sources of variation. Generalized, cross-wafer, and cross-die variation may be identified, and process settings may be adjusted to attempt to reduce such variation, thereby increasing the performance and profitability of the devices so produced.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A test structure, comprising:
   a first comb including a first base and a first plurality of fingers extending from the first base;
   a second comb including a second base and a second plurality of fingers extending from the second base, at least a portion of the first and second pluralities of fingers being interleaved;
   at least a first pair of base nodes extending from the first base to allow electrical interfacing with the test structure at the base nodes; and
   at least a second pair of finger nodes extending from a first finger of the first plurality of fingers to allow electrical interfacing with the test structure at the finger nodes.

2. The structure of claim 1, further comprising:
   a third pair of base nodes extending from the second base; and
   a fourth pair of finger nodes extending from a second finger of the second plurality of fingers.

3. The structure of claim 1, wherein the first comb is formed in a first layer of a device, the second pair of finger nodes are formed in a second layer of the device, and the structure further comprises a via coupling the second pair of finger nodes to the first finger.

4. The structure of claim 1, wherein the first comb is formed in a first layer of a device, one of the finger nodes in the second pair is formed in a second layer of the device, the other finger node of the second pair is formed in a third layer of the device and the structure further comprises vias coupling the finger nodes in the second pair to the first finger.

5. The structure of claim 1, further comprising a third comb including a third base and a third plurality of fingers extending from the third base, at least a portion of the first and third pluralities of fingers being interleaved.

6. The structure of claim 5, wherein the second pair of finger nodes pass between the second and third combs to connect to the first finger.

7. The structure of claim 1, further comprising a plurality of pairs of finger nodes each coupled to selected finger nodes from the first and second pluralities of fingers.

8. The structure of claim 1, further comprising a plurality of pads, each of the base nodes and finger nodes being coupled to one of the pads.

9. The structure of claim 1, wherein the first and second combs are formed in trenches defined in an insulating layer of a semiconductor device.

10. The structure of claim 1, wherein the first and second combs comprise copper.

11. A method, comprising:
   providing a test structure, the test structure comprising:
   a first comb including a first base and a first plurality of fingers extending from the first base;
   a second comb including a second base and a second plurality of fingers extending from the second base, at least a portion of the first and second pluralities of fingers being interleaved;
   at least a first pair of base nodes extending from the first base; and
   at least a second pair of finger nodes extending from a first finger of the first plurality of fingers;
   providing a first current through one of the base nodes and one of the finger nodes;
   measuring a first voltage across the remaining base node and the remaining finger node; and
   determining a resistance of the first finger based on the first voltage and a magnitude of the first current.

12. The method of claim 11, further comprising measuring a capacitance of the test structure.

13. The method of claim 11, farther comprising measuring a leakage current of the test structure.

14. The method of claim 11, wherein the test structure further comprises a third pair of finger nodes extending from a selected finger of one of the first and second pluralities of fingers, and the method further comprises:
   determining a resistance of the second finger using the third pair of finger nodes; and
   comparing the resistance of the first and second fingers to identify variation in the fingers across the test structure.

15. The method of claim 14, wherein the selected finger comprises one of the second plurality of fingers, the test structure further comprises a fourth pair of base nodes extending from the second base, and the method further comprises:
   providing a second current through one of the base nodes of the fourth pair and one of the finger nodes of the third pair;
   measuring a second voltage across the remaining base node of the fourth pair and the remaining finger node of the third pair; and
   determining a resistance of the second finger based on the second voltage and a magnitude of the second current.

16. The method of claim 11, further comprising forming a plurality of test structures at a plurality of locations on a semiconductor wafer.

17. The method of claim 16, further comprising:
   determining a resistance of the first finger of each test structure; and
   comparing the resistances to identify across-wafer variation.

18. The method of claim 16, further comprising:
   determining a capacitance of each test structure; and
   comparing the capacitances to identify across-wafer variation.

19. The method of claim 16, further comprising:
   determining a leakage current of each test structure; and
   comparing the leakage currents to identify across-wafer variation.

20. The method of claim 11, further comprising:
   cutting the test structure along the first and second pluralities of fingers; and
   measuring at least one dimension of the fingers.

21. The method of claim 20, wherein measuring the at least one dimension further comprises measuring at least one of a width dimension, a depth dimension, a sidewall profile, and a degree of surface degradation.

* * * * *